United States Patent
Watanabe et al.

[19]

[11] Patent Number: 6,121,635
[45] Date of Patent: Sep. 19, 2000

[54] SEMICONDUCTOR LIGHT-EMITTING ELEMENT HAVING TRANSPARENT ELECTRODE AND CURRENT BLOCKING LAYER, AND SEMICONDUCTOR LIGHT-EMITTING INCLUDING THE SAME

[75] Inventors: Yukio Watanabe, Yokohama; Ryo Saeki, Ichikawa; Hideki Nozaki, Kawasaki, all of Japan

[73] Assignee: Kabushiki Kaisha Toshiba, Kanagawa-ken, Japan

[21] Appl. No.: 09/060,549

[22] Filed: Apr. 15, 1998

[30] Foreign Application Priority Data

Apr. 15, 1997 [JP] Japan ................................. 9-111813
Feb. 23, 1998 [JP] Japan ................................. 10-040707

[51] Int. Cl.[7] .................................................. H01L 33/00
[52] U.S. Cl. .............................. 257/91; 257/94; 257/96; 257/99; 257/103; 257/102
[58] Field of Search ................................ 257/94, 96, 101, 257/102, 103, 91, 99, 100; 372/45, 46

[56] References Cited

U.S. PATENT DOCUMENTS 5,226,053 7/1993 Cho et al. ................................. 372/46
5,481,122 1/1996 Jou et al. ................................. 257/103
5,744,828 4/1998 Nozaki et al. ............................ 257/98
5,814,839 9/1998 Hosoba .................................... 257/99
5,933,443 8/1999 Mushiage et al. ....................... 372/46

*Primary Examiner*—Minh Loan Tran
*Attorney, Agent, or Firm*—Hogan & Hartson, LLP

[57] ABSTRACT

A current blocking layer (7) formed immediately below a transparent electrode (9) is formed of a semiconductor layer containing Al, and a bandgap equal to or longer than the emission wavelength. Since the current blocking layer (7) is formed of such semiconductor layer, an oxide film forms on or near the surface of the current blocking layer (7) in a process of forming the transparent electrode (9) such as an ITO film containing oxygen, and the current blocking layer functions effectively. The diameter of a bonding electrode (20) is set to be smaller than that of the current blocking layer (7), thus effectively outputting the light emitted. Furthermore, the oxidized current blocking layer can have a high breakdown voltage and, hence, can be formed to have a small thickness, thus improving step coverage upon forming the transparent electrode on the current blocking layer. By inserting a thin Zn layer (8) between the transparent electrode (9) and an ohmic layer (6), the adhesion therebetween can be improved.

15 Claims, 14 Drawing Sheets

SEMICONDUCTOR LIGHT-EMITTING ELEMENT HAVING TRANSPARENT ELECTRODE AND CURRENT BLOCKING LAYER, AND SEMICONDUCTOR LIGHT-EMITTING INCLUDING THE SAME

BACKGROUND OF THE INVENTION

The present invention relates to a semiconductor light-emitting element and its manufacturing method, and a semiconductor light-emitting device and, more particularly, to a semiconductor light-emitting element having a transparent electrode and its manufacturing method.

FIG. 22 shows a longitudinal-sectional structure of a semiconductor light-emitting element to which the present invention is directed. An AuGe n-type electrode (substrate-side electrode; to be referred to as an n-electrode hereinafter) 29 is formed on the first major surface of an n-GaAs substrate 28. Semiconductor layers are stacked in turn on the second major surface of the n-GaAs substrate 28 by, e.g., metal organic chemical vapor deposition (to be referred to as MOCVD hereinafter) or the like. That is, an n-GaAs buffer layer 27 is grown on the second major surface. A reflection layer 26 made up of 10 pairs of n-GaAs/n-In$_{0.5}$Al$_{0.5}$P films is grown on the surface of the buffer layer 27. An n-In$_{0.5}$Al$_{0.5}$P cladding layer (n-cladding layer) 25 is formed on the surface of the reflection layer 26. An In$_{0.5}$(Ga$_{0.55}$Al$_{0.45}$)$_{0.5}$P active layer 24 is formed on the surface of the n-cladding layer 25. A p-In$_{0.5}$Al$_{0.5}$P cladding layer (p-cladding layer) 23 is formed on the surface of the active layer 24. The p-cladding layer 23, active layer 24, and n-cladding layer 25 make up a light-emitting layer 30 having a doublehetero structure. A current diffusion layer 22 is formed on the light-emitting surface of the light-emitting layer 30, and a p-GaAs ohmic-contact layer 21 is grown on the current diffusion layer 22. An Au p-type electrode (light output electrode; to be referred to as a p-electrode hereinafter) 20 is formed on the ohmic-contact layer 21. These semiconductor layers are formed by, e.g., MOCVD.

A p-type semiconductor layer normally has low resistivity. Hence, when the p-electrode 20 for current injection and active layer 24 are located at neighboring positions, i.e., when the current diffusion layer 22 is not formed, currents spread little, and those portions immediately below the p-electrode 20 and near the electrode readily emit light. As a result, the luminous efficiency lowers considerably.

When currents are concentrated, the forward-bias voltage rises. In order to allow easy spread of currents, a current diffusion layer 22 having relatively low resistance and low absorption with respect to the emission wavelength is often formed. Furthermore, in order to remove light emission immediately below the p-electrode 20, a light-emitting element which has a current blocking layer for blocking currents, between the doublehetero structure and the current diffusion layer, and requires two growth processes, has been proposed. Since the surface of the current blocking layer serves as the surface to be regrown, the current blocking layer is normally formed of a layer containing no Al to avoid problems such as oxidation.

For the current blocking layer containing no Al, GaAs, GaAsP, InGaAs, InGaAsP, and the like may be used. For example, in an InGaAlP-based semiconductor light-emitting element, GaAs is used as a multilayered film formed on the uppermost surface. Since GaAs is not transparent to the emission wavelength in the InGaAlP-based semiconductor light-emitting element, a thin GaAs layer is formed. However, absorption occurs, and light emitted near the peripheral portion below the current blocking layer cannot be effectively output, resulting in low luminous efficiency.

As the current diffusion layer, a GaAlAs layer is used. However, since the GaAlAs layer has a carrier concentration of about 2E18 cm$^{-3}$ and a resistivity as high as 7E-2Q cm, spread of currents injected from the p-electrode is insufficient, and light emission cannot spread to the entire surface. For this reason, especially in a green InGaAlP-based semiconductor light-emitting element, the element peripheral portion that does not emit light becomes an absorption band of the emitted light, and light emission is observed at an exit in the lateral direction, i.e., in a direction parallel to the active layer while being shifted to longer wavelength. For this reason, this semiconductor light-emitting element is mounted on a frame without any reflection plate so as not to leak lateral light emission via a lens. hence, light in the lateral direction cannot be effectively used, resulting in low luminous efficiency.

Also, the active layer of a light-emitting diode (LED) using an InGaAlP-based semiconductor to which the present invention is directed is not doped with any impurity intentionally, and as a consequence, the active layer is of n-type having a carrier concentration of about 1E16 cm$^{-3}$. Hence, the LED has an n-n$^-$-p doublehetero structure (see FIG. 22). In this case, as shown in FIG. 22, the minority carriers injected into the active layer are not electrons 31 but holes 32. The luminous efficiency of the LED depends on the minority carrier lifetime. The luminous efficiency of the LED is improved as the minority carriers have less probability of nonradiative recombination in the active layer, i.e., as they have longer lifetime. In this case, since the minority carriers are holes, which normally have a short lifetime, improvement of luminous efficiency is limited.

One of semiconductor light-emitting elements to which the present invention is applied has a transparent electrode and current blocking layer, as shown in FIG. 24. In such light-emitting element, an AuGe n-electrode 202 is formed on the first major surface of an n-GaAs substrate 201, and a plurality of semiconductor layers are stacked on its second major surface by MOCVD.

An n-GaAs buffer layer 203 is formed on the second major surface of the substrate 201, and an n-GaAs/n-In$_{0.5}$Al$_{0.5}$P reflection layer 204, n-In$_{0.5}$Al$_{0.5}$p cladding layer 205, In$_{0.5}$(Ga$_{0.55}$Al$_{0.45}$)$_{0.5}$P active layer 206, and p-In$_{0.5}$Al$_{0.5}$P cladding layer 207 are formed in turn on the buffer layer. The n-cladding layer 205, active layer 206, and p-cladding layer 207 form a doublehetero layer 200.

A p-Ga$_{0.2}$Al$_{0.8}$As current diffusion layer 208 and p-GaAs ohmic-contact layer 209 are formed in turn on the top surface of the doublehetero layer 200, and an AuZn p-electrode 210 is formed on the surface of the contact layer 209.

As described above, the element to which the present invention is directed uses a GaAlAs-based semiconductor as the current diffusion layer 208. However, the resistivity of this layer 208 is too high to obtain sufficient spread of currents. For this reason, currents concentrate on the p-electrode 210. As a result, the internal quantum efficiency lowers due to heat generation, or the p-electrode 210 absorbs light, resulting in low light output efficiency.

As described above, the light-emitting element shown in FIG. 22 has low luminous efficiency. On the other hand, the light-emitting element shown in FIG. 24 has low internal quantum efficiency and light output efficiency.

SUMMARY OF THE INVENTION

It is, therefore, an object of the present invention to provide a semiconductor light-emitting element and its manufacturing method, and a semiconductor light-emitting device, which have high luminous efficiency or high internal quantum efficiency and light output efficiency.

The present invention is directed to a semiconductor element which has a transparent element containing oxygen and formed on the entire light-emitting surface, wherein a current blocking layer formed immediately below the transparent electrode is formed of a semiconductor layer which contains aluminum (Al), and has a bandgap equal to or higher than the emission wavelength.

Since the current blocking layer is formed of the semiconductor layer which contains aluminum (Al), and has a bandgap equal to or higher than the emission wavelength, an oxide layer forms on or near the surface of the current blocking layer in a process of forming the transparent electrode containing oxygen, and the current blocking layer effectively works.

Also, according to the present invention, the diameter of a bonding electrode is set to be smaller than that of the current blocking layer.

Light emission produced by currents flowing into the inner side near the current blocking layer can be effectively output by setting the electrode diameter to be smaller than that of the current blocking layer, since the current blocking layer is transparent to light emission. Furthermore, since the oxidized current blocking layer has higher breakdown voltage than that of a semiconductor layer having an equivalent thickness, it can be formed with a smaller thickness, and can improve step coverage upon forming the transparent electrode on the blocking layer.

Furthermore, according to the present invention, a thin Zn layer or a Zn layer containing Au is interposed between the transparent layer and ohmic-contact layer.

Since the thin Zn layer or Zn layer containing Au is interposed, the adhesion can be improved. In some cases, Zn may diffuse into the current blocking layer in a heating process or the like in the element formation processes, and the current blocking layer may not effectively function. However, since the semiconductor layer containing oxidized Al is formed, Zn diffuses little, and the current blocking layer functions effectively. Since the transparent electrode is formed, the element can be mounted on a frame with a reflection plate, thus improving light output efficiency of the light emitted.

Moreover, according to the present invention, in a semiconductor light-emitting element which has a current blocking layer containing Al, and a Zn layer between a transparent electrode and ohmic-contact layer, and uses InGaAlP as an active layer material, the active layer uses a p-type semiconductor having a carrier concentration of about 5E16 $cm^{-3}$ to 2E17 $cm^{-3}$ by doping zinc (Zn), cadmium (Cd), beryllium (Be), magnesium (Mg), or carbon (C) thereto.

Since the active layer uses the p-type semiconductor, green-, yellowish green-, yellow-, orange-, and red-emitting diodes with greatly improved luminous efficiency can be obtained.

Alternatively, a semiconductor light-emitting element according to the present invention comprises a semiconductor substrate, a light-emitting layer which is formed on the semiconductor substrate and has a doublehetero structure including a cladding layer and active layer to form a p-n junction, a current blocking layer formed on the light-emitting layer, and a transparent electrode formed on the current blocking layer, and the distance between the active layer and current blocking layer falls within the range from 0.3 $\mu$m to 3.0 $\mu$m.

Since the distance between the active layer and current blocking layer falls within the range from 0.3 $\mu$m to 3.0 $\mu$m, the current blocking layer can effectively suppress concentration of currents.

Note that a current diffusion layer having a different crystal structure from that of the light-emitting layer is preferably formed between the light-emitting layer and current blocking layer.

A semiconductor light-emitting layer according to the present invention comprises a semiconductor substrate, a light-emitting layer which is formed on the semiconductor substrate and has a doublehetero structure including a cladding layer and active layer to form a p-n junction, a current blocking layer formed on at least a portion of the light-emitting layer, a current diffusion layer formed on the light-emitting layer and current blocking layer, and a transparent electrode formed on the current blocking layer, and the distance between the active layer and current blocking layer falls within the range from 0.3 $\mu$m to 3.0 $\mu$m. In this way, the current diffusion layer may be formed on the upper surface of the current blocking layer.

When the thickness of the semiconductor light-emitting element is 150 $\mu$m or less, the element can be separated from the wafer by breaking.

Also, according to the present invention, high luminous efficiency can be assured even when the semiconductor light-emitting element has a chip size of 250 $\mu$m or less.

When the edge portion of the transparent electrode is located inside the chip edge portion of the semiconductor light-emitting element, the distance between the light-emitting layer and transparent electrode is increased, and the element can be protected from static damage arising from attachment of, e.g., dust.

Note that the transparent electrode may have either a circular or polygonal shape.

Such semiconductor light-emitting element can be manufactured by a manufacturing method comprising the step of growing, on one major surface of a semiconductor substrate, a light-emitting layer with a doublehetero structure including a cladding layer and active layer to form a p-n junction, the step of forming a current blocking layer on the light-emitting layer with a distance from the active layer falling with a range from 0.3 $\mu$m to 3.0 $\mu$m, and the step of forming a transparent electrode on the current blocking layer.

Note that the method preferably further comprises the step of forming a current diffusion layer having a different crystal structure form that of the light-emitting layer between the light-emitting layer and current blocking layer.

In summary, as the distance between the active layer and current blocking layer falls within the range from 0.3 $\mu$m to 3.0 $\mu$m, concentration of currents in a portion below the electrode can be suppressed, high luminous efficiency can be assured even when the chip size is reduced, and a cost reduction can also be attained as a result of an element area reduction.

When the edge portion of the transparent electrode is located inside the chip edge portion, static damage arising from dust or the like can be prevented, and ESD breakdown voltage can be improved.

DESCRIPTION OF THE PREFERRED EMBODIMENTS

The preferred embodiments of the present invention will be described hereinafter with reference to the accompanying drawings.

Figure 1:
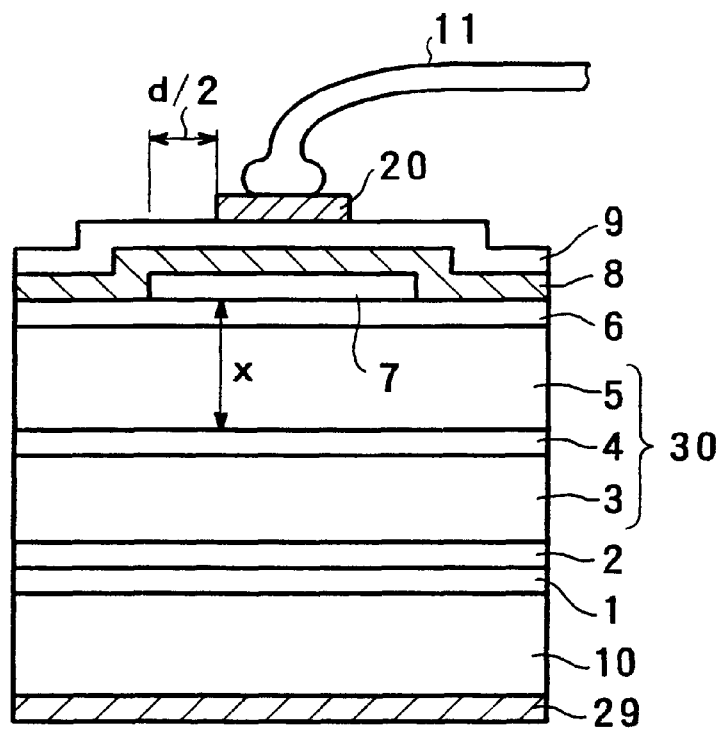
FIG. 1 is a longitudinal sectional view showing the structure of a semiconductor light-emitting element according to the first embodiment of the present invention.
Figure 2:
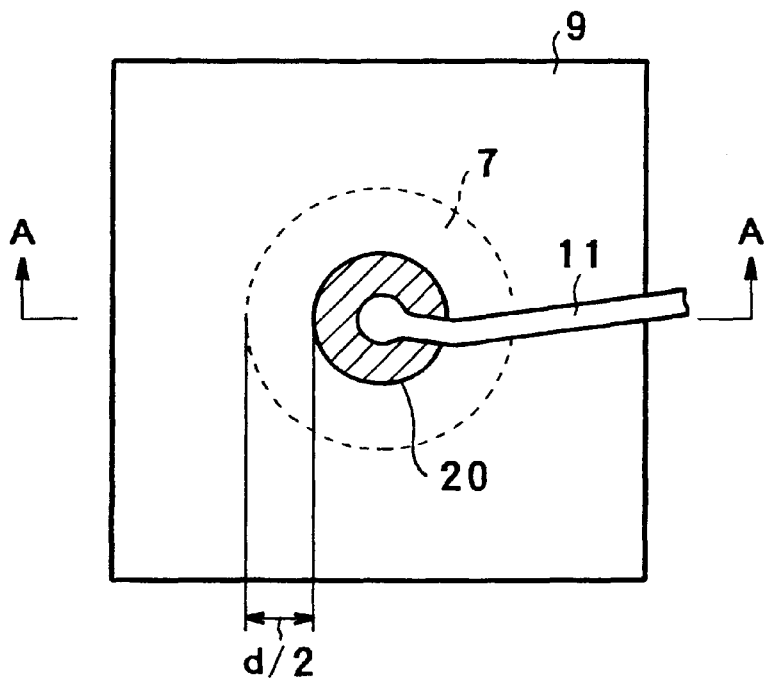
FIG. 2 is a plan view of the semiconductor light-emitting element shown in FIG. 1.

The first to sixth embodiments aim at improving luminous efficiency. A semiconductor light-emitting element according to the first embodiment of the present invention has a structure, as shown in FIGS. 1 and 2. FIG. 1 is a longitudinal sectional view of the semiconductor light-emitting element, and FIG. 2 is a plan view of the element. Note that FIG. 1 is a longitudinal sectional view taken along a line A—A in FIG. 2.

A 0.5-$\mu$m thick n-GaAs buffer layer 1, a 0.76-$\mu$m thick reflection layer 2 consisting of 10 pairs of n-GaAs/n-In$_{0.5}$Al$_{0.5}$P films, a 0.6-$\mu$m thick n-In$_{0.5}$Al$_{0.5}$P cladding layer 3, a 1.0-$\mu$m thick, Zn-doped In$_{0.5}$(Ga$_{0.55}$Al$_{0.45}$)$_{0.5}$P active layer 4, a 1.0-$\mu$m thick p-In$_{0.5}$Al$_{0.5}$P cladding layer 5, a 0.01-$\mu$m thick p-GaAs ohmic-contact layer 6, and an n-In$_{0.5}$Al$_{0.5}$P current blocking layer 7 having a thickness of 0.01 $\mu$m to 0.2 $\mu$m are sequentially grown on the surface of a 250-$\mu$m thick n-GaAs substrate 10 by, e.g., MOCVD. After that, the current blocking layer 7 portion corresponding to an energization region is selectively removed to expose the p-GaAs ohmic-contact layer 6 using hot phosphoric acid or sulfuric acid via a photoresist process, thereby forming a current blocking layer 7 having a diameter of about 110 $\mu$m located at nearly the center of the substrate 10. Subsequently, the photoresist is removed, and the structure is washed and dried.

A Zn layer 8 having a thickness of 1 to 4 nm is deposited on the entire surface of the GaAs ohmic-contact layer 6 as well as the surface of the current blocking layer 7 using AuZn metal. Then, a 100-nm thick indium oxide (In$_2$O$_3$)-tin oxide (SnO$_2$) film (to be referred to as an ITO film hereinafter) 9 is deposited by a sputtering device by supplying a gas mixture of Ar and oxygen (pressure ratio of 100:1) in a vacuum of about 1E-3 torr, and heating to a temperature of 150° C. to 200° C. Furthermore, after a 200-nm thick AuGe electrode 29 is formed on the n-GaAs substrate 10 side, and a 1.2-$\mu$m thick Au film is formed on the ITO film 9, the structure is subjected to a heat treatment in Ar atmosphere at about 430° C. for about 15 min. After the heat treatment, the Au film is patterned to have a diameter smaller than that of the current blocking layer 7, i.e., about 100 $\mu$m, thus forming a bonding p-electrode 20. Finally, the structure undergoes scribing and breaking from its rear surface side in units of 150-$\mu$m squares using a scribe device having a diamond stylus, so as to cut and separate the substrate in units of semiconductor light-emitting elements (pellets).

A bonding wire 11 connected to an external terminal (not shown) to be connected to a power supply is connected to the p-electrode 20. A light-emitting layer 30 is constituted by the n-cladding layer 3, active layer 4, and p-cladding layer 5. The p-electrode 20 is formed at nearly the center of the current blocking layer 7, and a diameter difference d between them is roughly three times a distance x from the current blocking layer 7 to the active layer 4 (d$\geq$10x).

A green semiconductor light-emitting element manufactured via the above-mentioned processes has improved adhesion with a transparent electrode as compared to an element using a current blocking layer containing no Al. The current blocking layer containing no Al may lose its function after a heat treatment in, e.g., an electrode formation process or the like. By contrast, the current blocking layer containing Al does not suffer any breakdown voltage drop even after the heat treatment.

Also, the adhesion between the GaAs contact layer and ITO film, and that between the current blocking layer containing Al and ITO film can be further improved by interposing the Zn layer 8. For this reason, cracking and peeling upon chipping and breaking during scribing from the surface using a scribe device can be remarkably avoided, and elements can be formed using the scribe device.

Note that the adhesion increases as the Zn layer has a larger thickness. However, in such case, since light absorption exponentially increases, about 5 nm are the maximum thickness that does not cause any luminous efficiency drop. If the Zn layer thickness exceeds 5 nm, luminous efficiency drop occurs considerably. Since the element adopts a structure formed with a transparent electrode, the need for a current diffusion layer can be obviated. In addition, since the grown layers have very small thicknesses, the yield upon breaking can be greatly improved.

Furthermore, the blocking layer has a structure transparent to light emission, and the bonding p-electrode is formed with a small electrode diameter, so that the diameter difference between the p-electrode and blocking layer becomes three times or more the distance from the surface to the light-emitting layer. With this structure, light emission produced by currents flowing to the portion below the blocking layer peripheral portion can be effectively output. As a result of analysis of the surface of the current blocking layer using a secondary ion-mass spectrometer, by forming a transparent electrode such as ITO containing oxygen, a strong aluminum oxide film is formed, and the blocking layer functions effectively. The functions of the current blocking layer never deteriorate by diffusion of Zn to improve the adhesion, and diffusion of Zn doped in the active layer to improve the luminous efficiency. Zn may be doped in the active layer at 6E17 or more if only deterioration of the functions of the blocking layer is considered, but such amount is not preferable if the luminous efficiency and reliability of the semiconductor light-emitting element are also considered. Upon conducting high-current density reliability tests at 50 mA, the current blocking layer functioned sufficiently.

In this embodiment, the Zn thin-film layer is formed by deposition based on resistive heating. Alternatively, the Zn thin-film layer may be continuously formed using a sputtering device used for forming a transparent electrode, thus improving the adhesion between the element surface and transparent electrode. In the above embodiment, Au is etched upon forming the bonding electrode. Alternatively, when the bonding electrode is formed by, e.g., the lift-off method, the relationship between the diameters of the current blocking layer and p-electrode can be improved.

Upon observation of light emission in the lateral direction of the element obtained by this embodiment, i.e., in a direction parallel to the active layer, the observed light had the same emission wavelength as that output from the surface, i.e., in a direction perpendicular to the active layer. When this element was mounted and bonded to a frame with a reflection plate, a light-emission output 130% that of a conventional element could be obtained.

The second embodiment will be explained below with reference to FIGS. 3 to 5.

Figure 3:
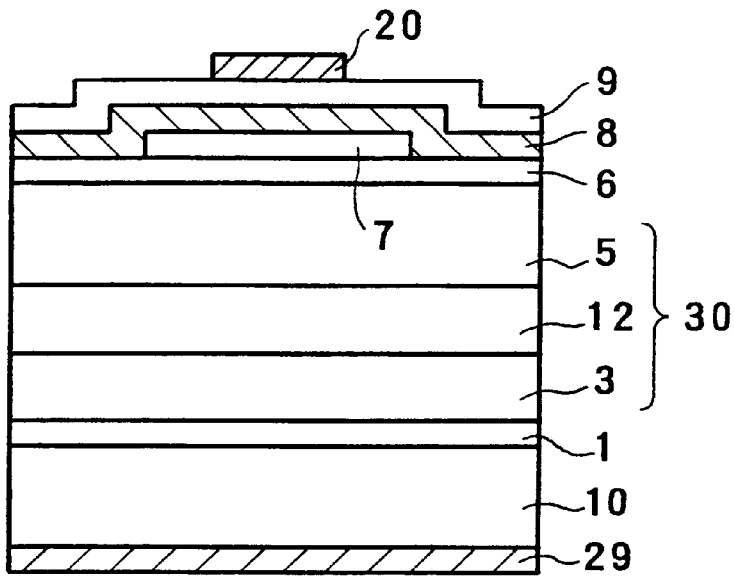
FIG. 3 is a sectional view showing the structure of a semiconductor light-emitting element according to the second embodiment of the present invention.
Figure 4:
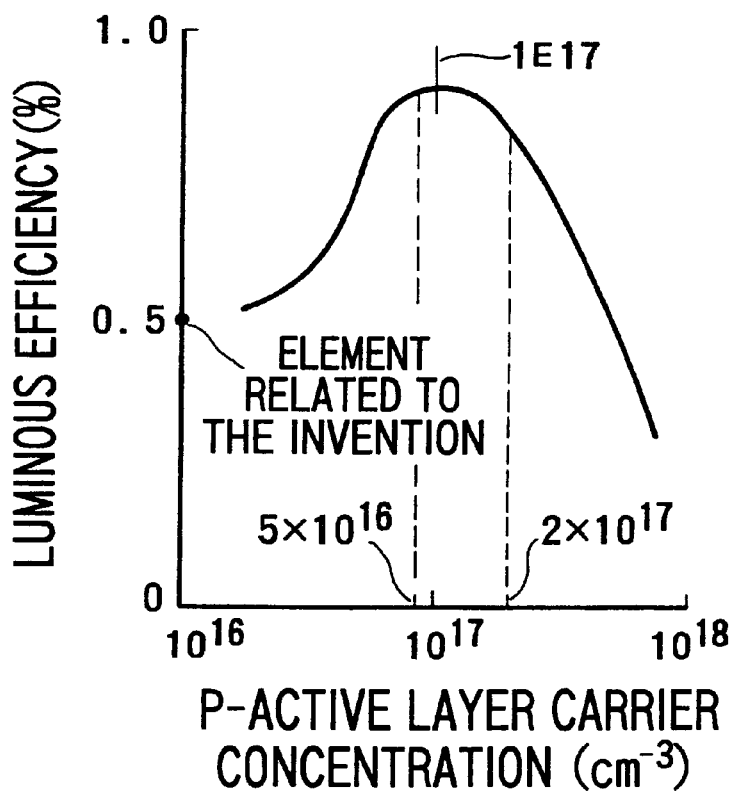
FIG. 4 is a graph showing the dependence of the luminous efficiency on the carrier concentration in the active layer in the semiconductor light-emitting element shown in FIG. 3.
Figure 5:
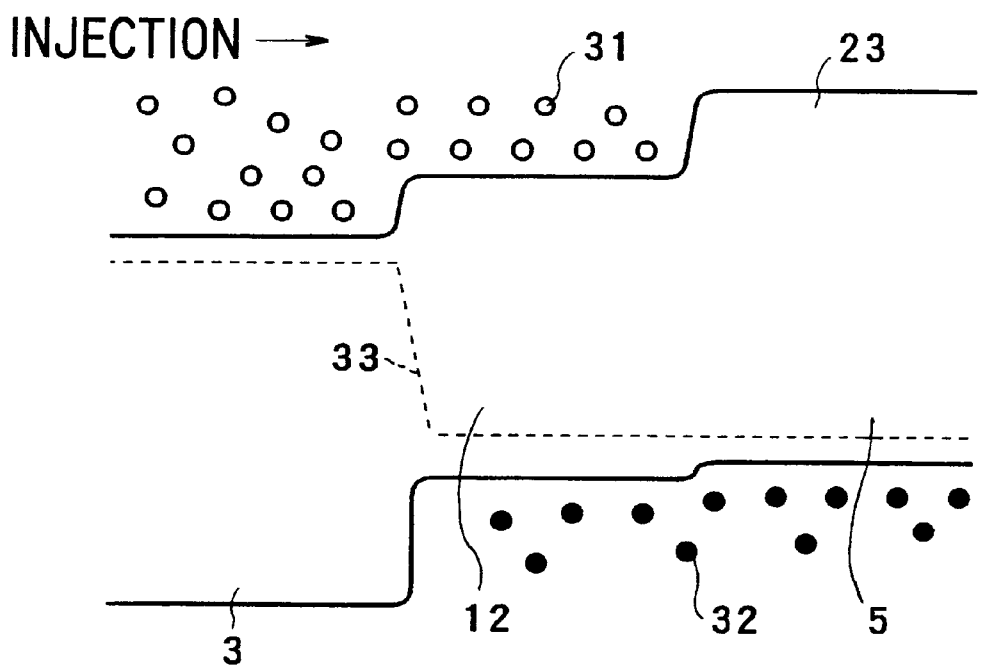
FIG. 5 is an explanatory view showing the band structure of the semiconductor light-emitting element shown in FIG. 3.

FIG. 3 is a sectional view of a semiconductor light-emitting element, and FIG. 4 shows the dependence of the luminous efficiency on the carrier concentration in the active layer in the semiconductor light-emitting element. Note that the ordinate in FIG. 4 plots the luminous efficiency (%), and the abscissa plots the carrier concentration of the active layer. FIG. 5 shows the bandgap of a light-emitting layer of the semiconductor light-emitting element shown in FIG. 3. A 0.5-$\mu$m thick n-GaAs buffer layer 1, a 0.6-$\mu$m thick n-$In_{0.5}Al_{0.5}P$ cladding layer 3, a 0.6-$\mu$m thick p$^-$-$In_{0.5}(Ga_{1-x}Al_x)_{0.5}P$ active layer 12, a 0.6-$\mu$m thick p-$In_{0.5}Al_{0.5}P$ cladding layer 5, a 0.01-$\mu$m thick p-GaAs ohmic-contact layer 6, and an n-$In_{0.5}Al_{0.5}P$ current blocking layer 7 having a thickness of 0.01 $\mu$m to 0.2 $\mu$m were sequentially grown on the surface of a 250-$\mu$m thick n-GaAs substrate 10 by, e.g., MOCVD or the like. After that, the current blocking layer was shaped so that the current blocking layer 7 having a diameter of about 111 $\mu$m was located at nearly the center of the substrate 10. Subsequently, a Zn layer 8 having a thickness of 1 to 4 nm was deposited on the entire surface of the GaAs ohmic-contact layer 6 as well as the surface of the current blocking layer 7 using an AuZn metal. Then, a 100-nm thick ITO film 9 was deposited by a sputtering device by supplying a gas mixture of Ar and oxygen (pressure ratio of 100:1) in a vacuum of about 1E-3 torr, and heating to a temperature of 150° C. to 200° C.

After a 200-nm thick AuGe electrode 29 was deposited on the n-GaAs substrate 10 side, and a 1.2-$\mu$m thick Au film was deposited on the ITO film 9, the structure was subjected to a heat treatment in Ar atmosphere at about 430° C. for about 15 min. After the heat treatment, the Au film was patterned to have a diameter smaller than that of the current blocking layer 7, i.e., about 100 $\mu$m, thus forming a bonding p-electrode 20. Finally, the structure underwent scribing and breaking from its rear surface side in units of 150-$\mu$m squares using a scribe device having a diamond stylus, so as to cut and separate the substrate in units of semiconductor light-emitting elements (pellets). A bonding wire (not shown) connected to an external terminal (not shown) to be connected to a power supply is connected to the p-electrode 20. The n-cladding layer 3, active layer 12, and p-cladding layer 5 form a light-emitting layer 30. The p-electrode 20 is formed at nearly the center of the current blocking layer 7, and the diameter difference between them is approximately three times the distance from the current blocking layer 7 to the active layer 4 to effectively use currents.

As described above, all these semiconductor layers are formed by MOCVD. As the material, an organic metal such as TMG, TMI, TMA, or the like, or hydroxide gas such as $AsH_3$, $PH_3$, or the like is used. Si (silicon) is doped into an n-semiconductor layer, and Zn (zinc) is doped into a p-layer. As the source materials, silane and DMZ are used respectively. The crystal growth temperature is about 700° C.

As shown in FIG. 4, the p$^-$-active layer 12 preferably has a carrier concentration falling with the range from 5E16 to 2E17 $cm^{-3}$. As the p-impurity to be doped into the active layer, Cd, Mg, C, Be, or the like may be used in addition to Zn mentioned above. Also, as shown in FIG. 5, the light-emitting layer of this embodiment has an n-p$^-$-p-type hetero structure, and electrons 31 are injected into the active layer 12. Hence, the carrier lifetime in the active layer can be prolonged, and luminous efficiency can be improved.

The third embodiment will be explained below with reference to FIG. 6.

Figure 6:
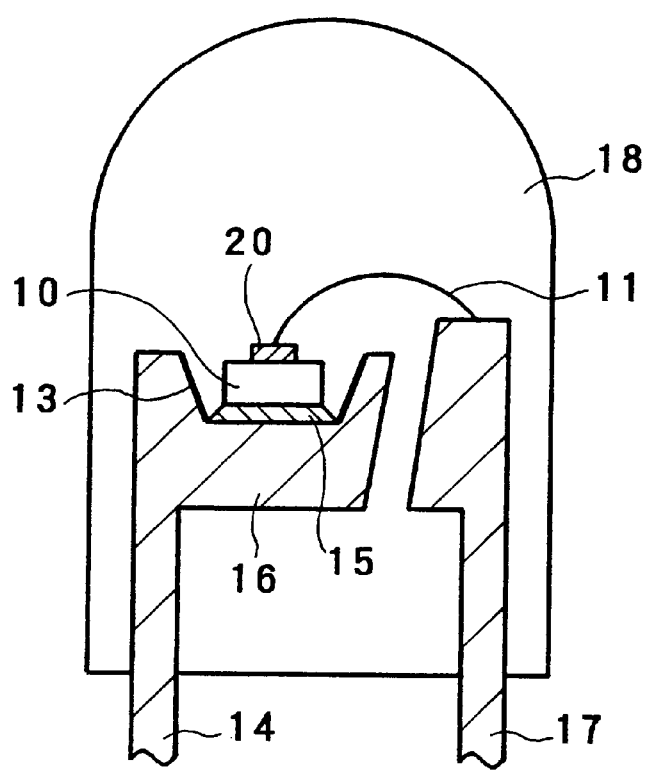
FIG. 6 is a longitudinal sectional view showing the structure of a semiconductor light-emitting element according to the third embodiment of the present invention.

FIG. 6 is a sectional view of a semiconductor light-emitting device that incorporates the semiconductor light-emitting element of the present invention. After the semiconductor substrate side of a semiconductor light-emitting element (pellet) 10 is die-bonded to a bed portion 16 of a lead 14 having a dish-like reflection plate 13 using a conductive adhesive 15 such as Ag paste, a p-electrode (light output electrode) 20 and a lead 17 are electrically connected to each other by an Au bonding wire 11. After that, the dish-shaped reflection plate 13, a portion of the lead 14, the conductive adhesive 15, semiconductor light-emitting element 10, the bed portion 16, the bonding wire 11, and a portion of the lead 17 are encapsulated into a bullet-shaped epoxy resin capsule 18. The resin capsule 18 has a lens function, and a function of protecting the semiconductor light-emitting element 10.

The semiconductor light-emitting element of the present invention shown in FIG. 1 and the like has the same emission wavelength in the lateral direction of the element, i.e., in a direction parallel to the active layer as that output in a direction perpendicular to the active layer. Hence, when a reflection plate was attached to the element to effectively output light emission as in this embodiment, a device having a light-emission output 130% that of a conventional device could be obtained.

The fourth embodiment will be described below with reference to FIG. 7.

Figure 7:
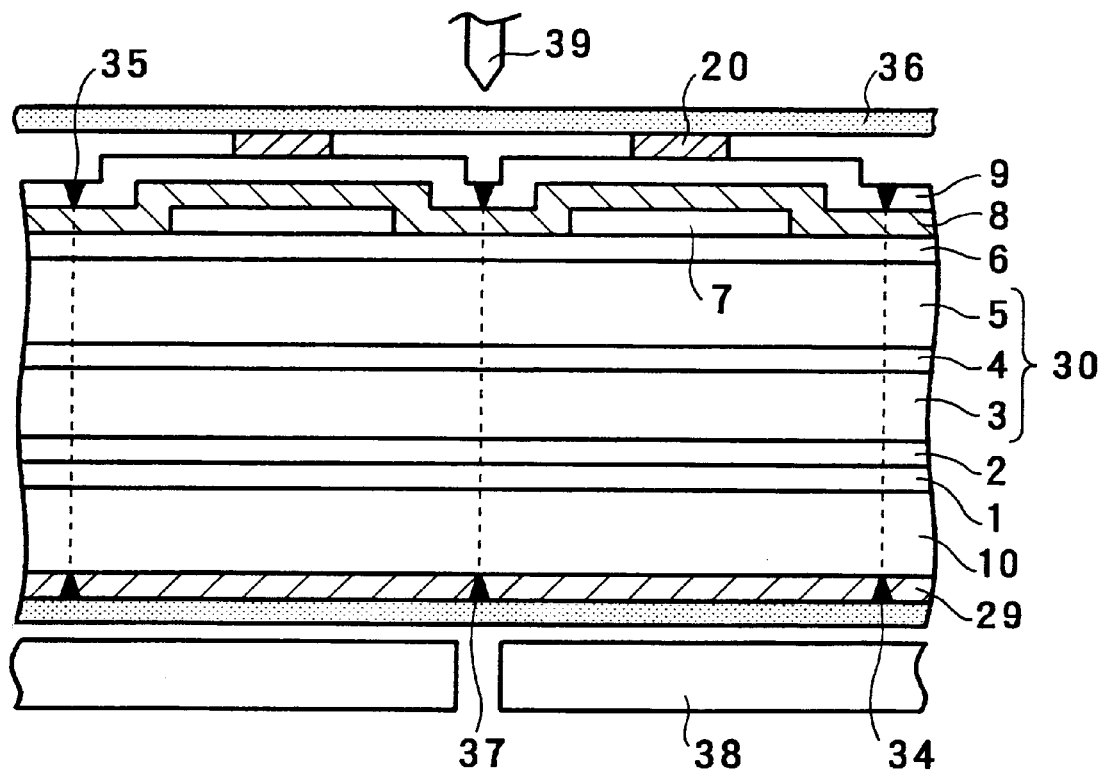
FIG. 7 is a sectional view of a semiconductor substrate for explaining the cutting method of a semiconductor light-emitting element according to the fourth embodiment of the present invention.

A semiconductor substrate shown in FIG. 7 is used for forming the semiconductor light-emitting element shown in FIG. 1. A scribe device with an infrared transmission function was prepared and used so as to align an Au electrode (p-electrode) pattern to a scribe line on a region without any AuGe electrode (n-electrode) 29 mentioned above. Using such scribe device, a load of 14 g is applied to a scribing diamond stylus, and the AuGe electrode 29 is subjected to scribing (to form scribe lines 34). After the scribing, an external force is applied to the light-emitting surface side, opposite to the scribed surface, of a semiconductor wafer to divide the wafer into pellets. As a result, pellets with a good shape could be obtained. Upon dividing the wafer into pellets, adhesion sheets 36 and 37 are adhered to the major surface on the light-emitting surface side, and the major surface on the substrate side, and a support plate 38 is placed under the adhesive sheet 37. Then, a cutter blade 39 is adjusted to a position 35 above the cleavage plane of the scribe line 34 on a cladding layer opposing the region where the support plate 38 is not placed, and a force is applied, thus cutting the wafer from the scribe line 34.

Furthermore, in order to improve finish dimensional precision of the light-emitting side (the surface formed with the p-electrode 20), after scribing is done on the n-electrode 29, scribing (sub-scribing) is performed on the p-cladding layer at a position opposite to the cleavage plane of the scribe line 34 on the n-electrode 29 by applying a load of 5 g to the diamond stylus (so as to form scribe lines 35). After that, an external force is applied to each scribe line 34 to divide the semiconductor wafer into pellets (the method of dividing the wafer by applying an external force is the same as that described above).

The adhesion between the GaAs contact layer and ITO film, and that between the current blocking layer containing Al and ITO film can be further improved by interposing the Zn layer 8. For this reason, cracking and peeling upon chipping and breaking during scribing from the surface using a scribe device can be remarkably avoided, and elements can be formed using the scribe device.

Hence, upon dividing the wafer into pallets, a pellet with high dimensional precision on the light-emitting surface side and a good shape can be obtained.

The fifth embodiment of the present invention will be described below.

Figure 8A:
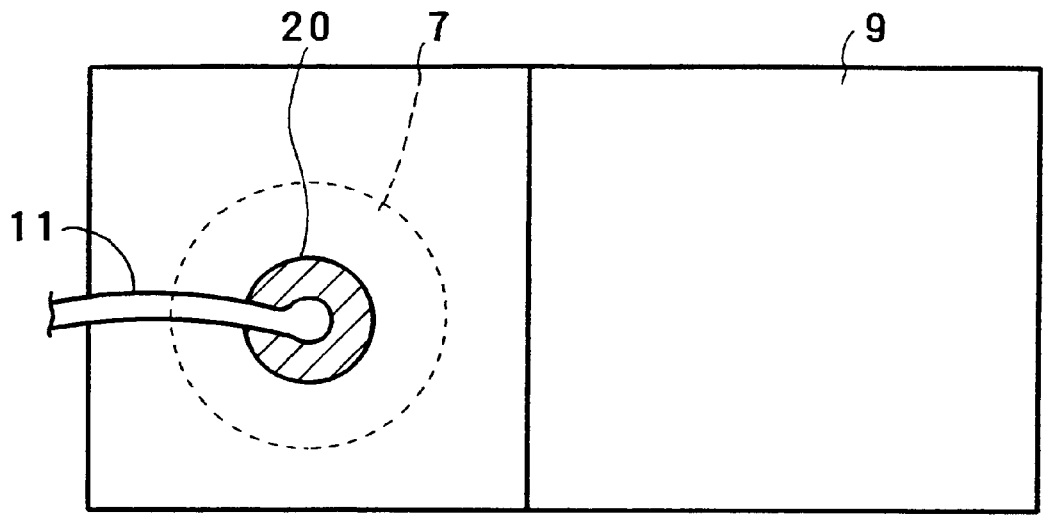
FIGS. 8A and 8B are respectively a plan view and longitudinal sectional view showing the structure of a semiconductor light-emitting element according to the fifth embodiment of the present invention.
Figure 8B:
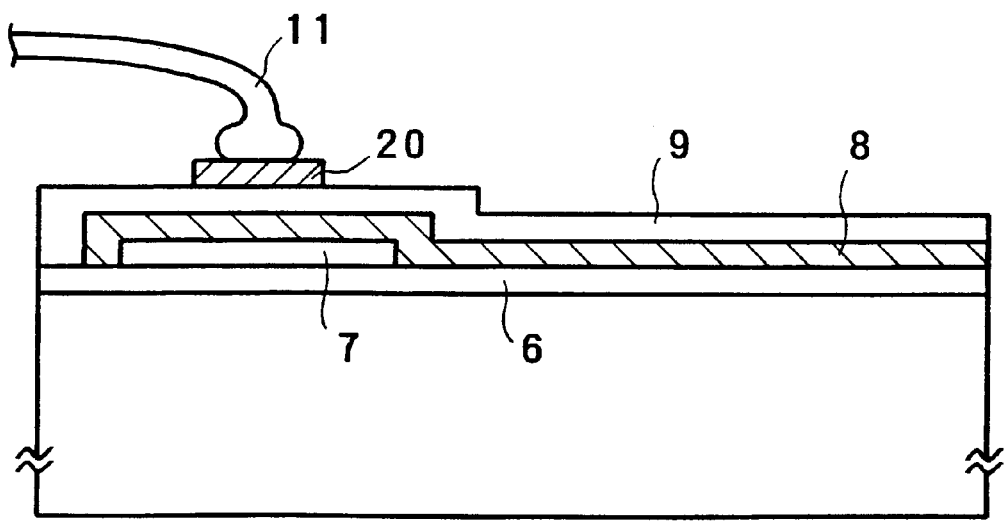

FIGS. 8A and 8B are respectively a plan view and sectional view showing the structure of a light output electrode (p-electrode) portion of a semiconductor light-emitting element according to this embodiment. In the element according to the first embodiment shown in FIG. 1, the p-electrode is formed at the central portion of the light-emitting surface formed with the transparent electrode (ITO film). By contrast, in this embodiment, the p-electrode is formed at the right or left offset portion on the light-emitting surface. Since the p-electrode 20 serving as a bonding electrode is formed at the offset position on the light-emitting surface, light emission can be effectively used.

Figure 9:
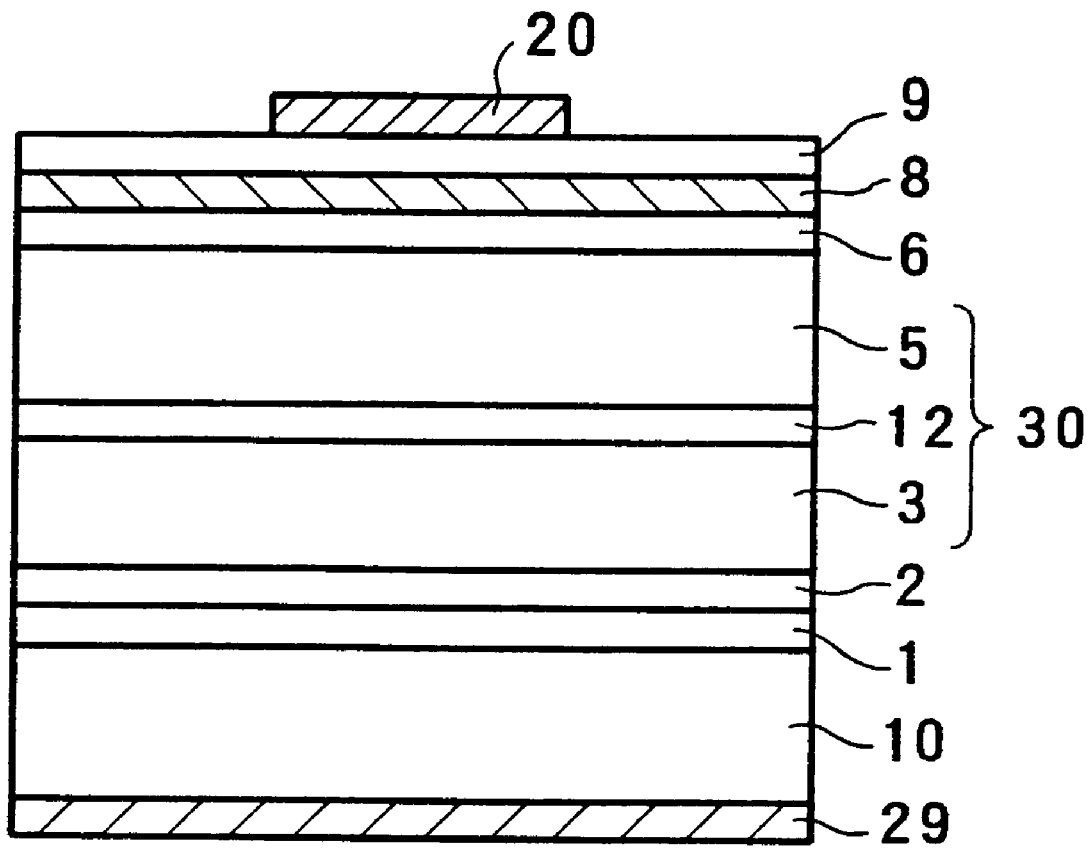
FIG. 9 is a longitudinal sectional view showing the structure of a semiconductor light-emitting element according to the sixth embodiment of the present invention.

A semiconductor light-emitting element having a Zn layer according to the sixth embodiment of the present invention will be explained below. FIG. 9 shows the sectional structure of this element. A 0.5-$\mu$m thick n-GaAs buffer layer 1, a reflection layer 2 consisting of 10 pairs of n-GaAs/n-In$_{0.5}$Al$_{0.5}$P films, a 0.6-$\mu$m thick n-In$_{0.5}$Al$_{0.5}$P cladding layer 3, a 1.0-$\mu$m thick, Zn-doped In$_{0.5}$(Ga$_{0.55}$Al$_{0.45}$)$_{0.5}$P active layer 4, a 1.0-$\mu$m thick p-In$_{0.5}$Al$_{0.5}$P cladding layer 5, and a 0.01-$\mu$m thick p-GaAs ohmic-contact layer 6 were sequentially grown on the surface of a 250-$\mu$m thick n-GaAs substrate 10 by, e.g., MOCVD.

Subsequently, a Zn layer 8 having a thickness of 1 to 4 nm was deposited on the entire surface of the GaAs ohmic-contact layer 6 using an AuZn metal. Then, a 100-nm thick ITO film 9 was deposited by a sputtering device by supplying a gas mixture of Ar and oxygen (pressure ratio of 100:1) in a vacuum of about 1E-3 torr, and heating to a temperature of 150° C. to 200° C. Furthermore, after a 200-nm thick AuGe electrode 29 was formed on the n-GaAs substrate 10 side, and a 1.2-$\mu$m thick Au film was formed on the ITO film 9, the structure was subjected to a heat treatment in Ar atmosphere at about 430° C. for about 15 min. After the heat treatment, the Au film was patterned to have a diameter of about 100 $\mu$m, thus forming a bonding p-electrode 20. Finally, the structure underwent scribing and breaking from its rear surface side in units of 150-$\mu$m squares using a scribe device having a diamond stylus, so as to cut and separate the substrate (wafer) in units of semiconductor light-emitting elements (pellets). The n-cladding layer 3, active layer 4, and p-cladding layer 5 form a light-emitting layer 30.

By interposing the Zn layer, the adhesion between the ohmic-contact layer and ITO film can be improved. For this reason, cracking and peeling upon chipping and breaking during scribing from the surface using a scribe device can be remarkably avoided, and elements can be formed using the scribe device. Note that the adhesion tends to increase as the Zn layer has a larger thickness. However, in such case, since absorption exponentially increases, about 5 nm are the maximum thickness that does not cause any luminous efficiency drop. If the Zn layer thickness exceeds 5 nm, luminous efficiency drop occurs considerably.

Figure 10:
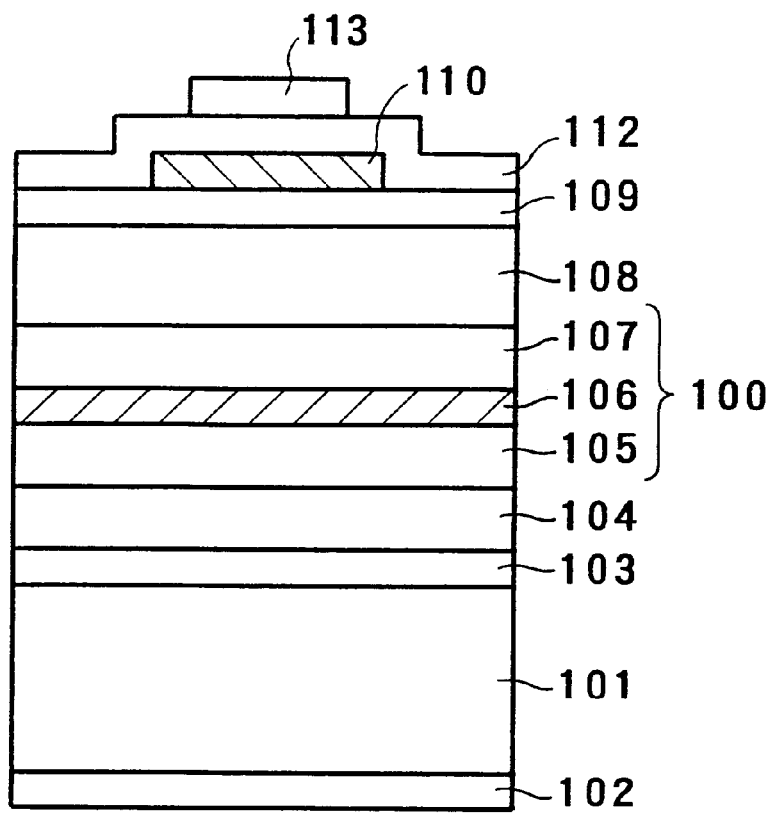
FIG. 10 is a longitudinal sectional view showing the structure of a semiconductor light-emitting element according to the seventh embodiment of the present invention.
Figure 11:
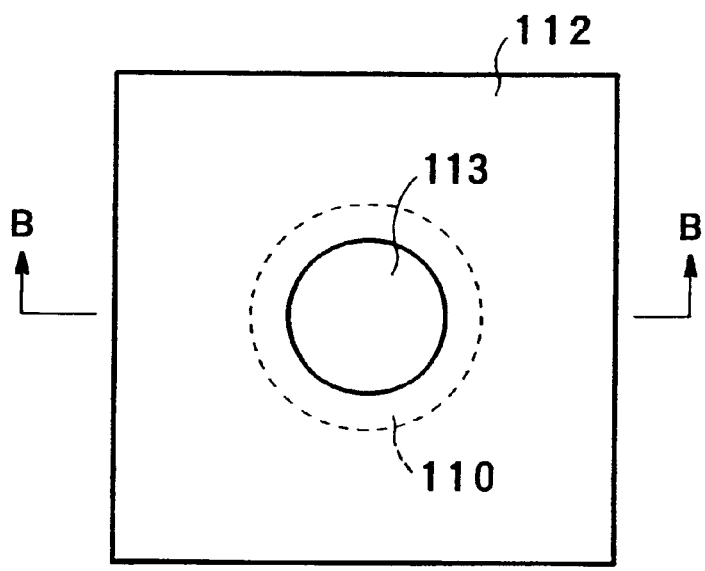
FIG. 11 is a plan view of the semiconductor light-emitting element shown in FIG. 10.

The seventh to ninth embodiments to be described below aim at preventing concentration of currents to a portion beneath a p-electrode, and improving the internal quantum efficiency and light output efficiency. FIG. 11 is a plan view of a semiconductor light-emitting element according to the seventh embodiment, and FIG. 10 is a longitudinal sectional view taken along a line B—B in FIG. 11. A 0.5-$\mu$m thick n-GaAs buffer layer 103, a 0.76-$\mu$m thick reflection layer 104 consisting of 10 pairs of n-GaAs/n-In$_{0.5}$Al$_{0.5}$P films, a 0.6-$\mu$m thick n-In$_{0.5}$Al$_{0.5}$P cladding layer 105, a 1.0-$\mu$m thick In$_{0.5}$(Ga$_{0.55}$Al$_{0.45}$)$_{0.5}$P active layer 106, a 1.0-μm thick p-In$_{0.5}$Al$_{0.5}$P cladding layer 107, a 1.0-μm thick p-Ga$_{0.2}$Al$_{0.8}$As current diffusion layer 108, a 0.01-μm thick p-GaAs contact layer 109, and a 0.2-μm thick n-In$_{0.5}$Al$_{0.5}$P current blocking layer 110 are sequentially grown on the second major surface of a substrate 101 by MOCVD.

Furthermore, the current blocking layer 110 corresponding to an energization region is patterned by photolithography and etching. As a result of patterning, a current blocking layer 110 having a diameter of 120 μm and located at nearly the center of the substrate 101 is formed. A 100-nm thick indium oxide (In$_2$O$_3$)-tin oxide (SnO$_2$) (to be referred to as ITO hereinafter) film 112 is deposited on the entire surface of the contact layer 109 as well as the surface of the current blocking layer 110. This film 112 is deposited by sputtering by supplying a gas mixture of Ar and oxygen (pressure ratio of 100:1) in a vacuum of about 1E-3 torr and heating the substrate 101 to a temperature of 150° C. to 200° C.

A 1.0-μm thick Au film is deposited on the surface of the ITO film 112. The wafer is polished to have a thickness of about 100 μm. After a 200-nm thick AuGe n-electrode 102 is deposited on the first major surface of the n-GaAs substrate 101, the structure is subjected to a heat treatment in Ar atmosphere at about 450° C. for about 10 min. The Au film is patterned to have a diameter of 100 μm smaller than that of the current blocking layer 110, thus forming a p-electrode 113. Finally, scribing is done from the rear surface of the semiconductor wafer in units of 150 μm squares using a scribe device having a diamond stylus to separate the wafer into elements by breaking, thus ending the processes.

Figure 20:
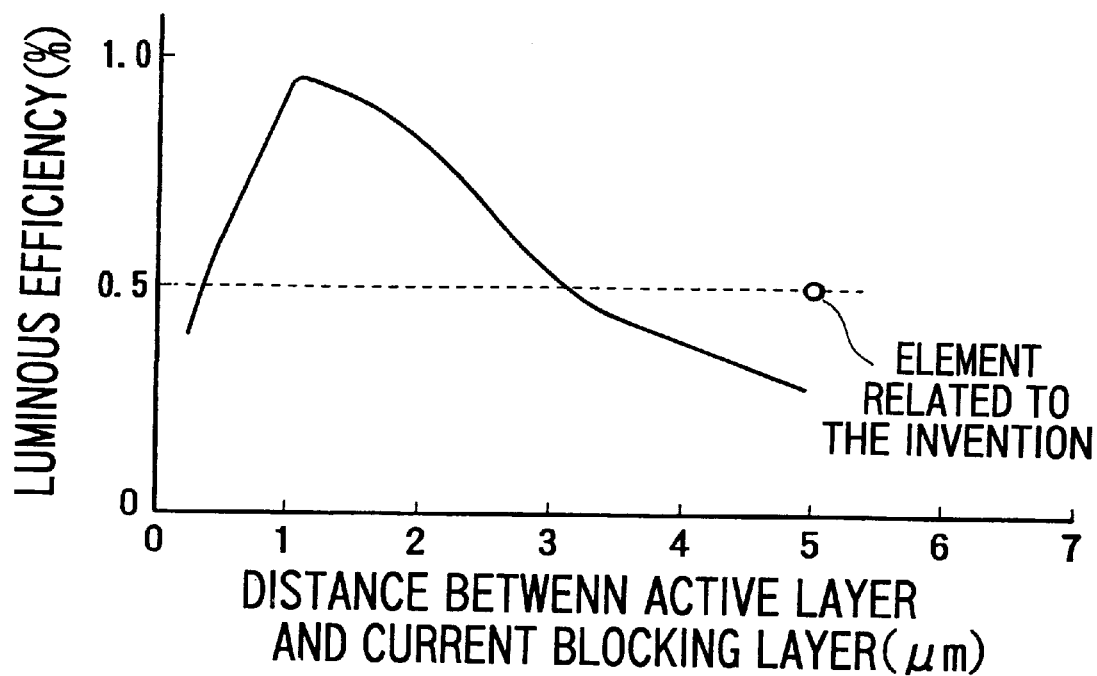
FIG. 20 is a graph showing the relationship between the distance between the active layer and current blocking layer, and luminous efficiency in the semiconductor light-emitting element of the seventh embodiment, and that to which the present invention is applied.

FIG. 20 shows the relationship between the distance between the active layer 106 and current blocking layer 110, i.e., the total of the film thicknesses of the p-cladding layer 107 and current diffusion layer 108, and luminous efficiency. Due to the presence of the ITO film 112, a uniform electric field is applied to the element, and currents can flow uniformly without being concentrated on the portion immediately below the p-electrode 113. The light output can be increased as compared to a case wherein a current diffusion layer 108 having a thickness of 5 to 7 μm is formed without forming the ITO film 112.

However, since a uniform electric field is applied to the element, currents readily flow into the portion below the current blocking layer 110. In order to solve this problem, the distance between the active layer 106 and current blocking layer 110 is important. If the distance of this portion becomes equal to or larger than 3 μm, the effect of suppressing current concentration by the current blocking layer 110 cannot be expected.

Conversely, when the distance between the active layer 106 and current blocking layer 110 is equal to or smaller than 0.3 μm, i.e., only the cladding layer 107 is formed between these layers without forming the current diffusion layer 108, the element is easily influenced by bonding on the p-electrode 113, resulting in a light output drop.

When a GaAs-based diffusion layer 108 having a lattice constant different from that of an In$_{0.5}$(Ga$_{1-x}$Al$_x$)$_{0.5}$P-based crystal is formed to have a thickness of 3 μm or more, the wafer warps considerably when the substrate is polished to have a wafer thickness of about 150 μm or less and the wafer is separated into semiconductor chips by scribing and breaking. For this reason, deviation of scribe lines and cracking of the wafer during processes easily occur, resulting in low yield. Furthermore, in the element structure formed with the ITO film, the current diffusion layer 108 does not directly contribute to the light output. However, in order to eliminate damages to the active layer 106 upon bonding when the element is mounted on an LED lamp or upon breaking, a gap of 1 to 2 μm is preferably formed between the active layer 106 and current blocking layer 110. In consideration of the above situations, in the seventh embodiment, the distance between the active layer 106 and current blocking layer 110 is set to fall within the range from 0.3 μm to 3 μm.

Figure 21:
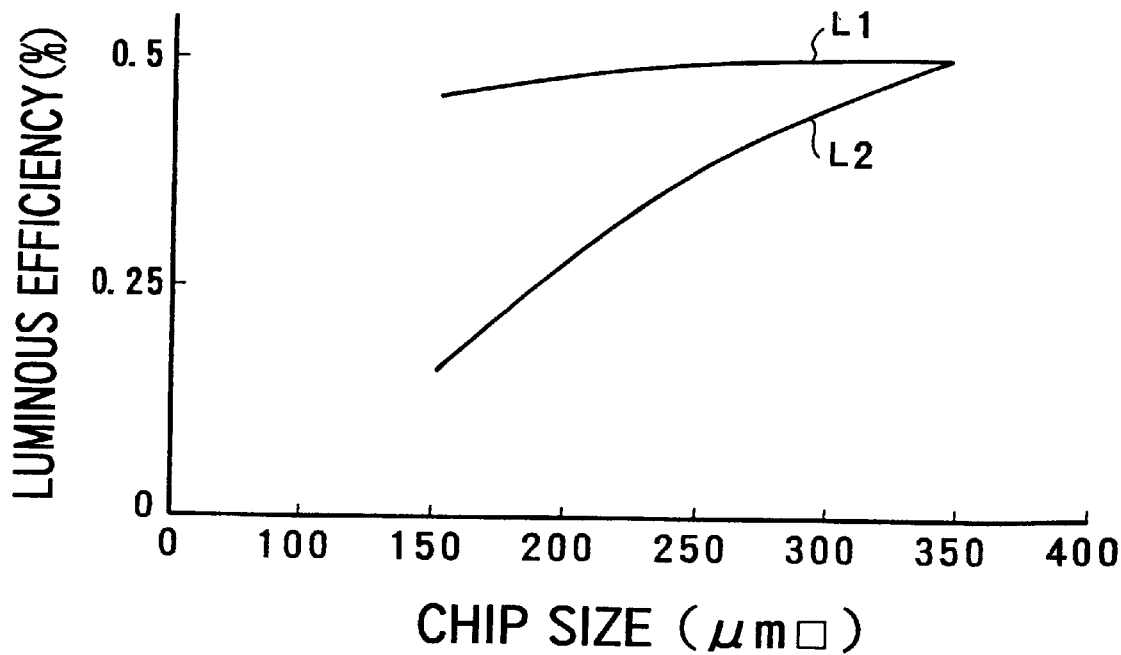
FIG. 21 is a graph showing the relationship between the semiconductor chip size and luminous efficiency in the semiconductor light-emitting element of the seventh embodiment, and that to which the present invention is applied.
Figure 22:
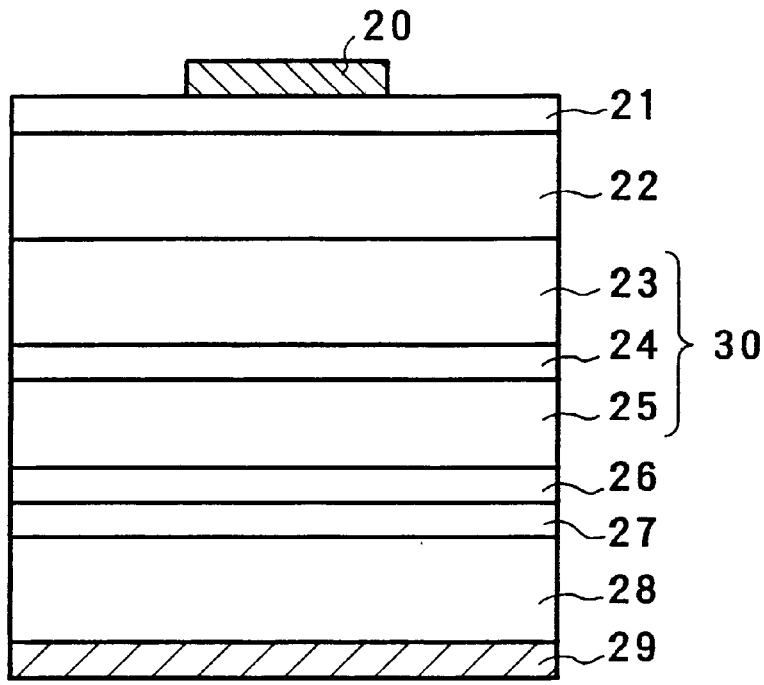
FIG. 22 is a sectional view showing the structure of a semiconductor light-emitting element to which the present invention is directed.
Figure 23:
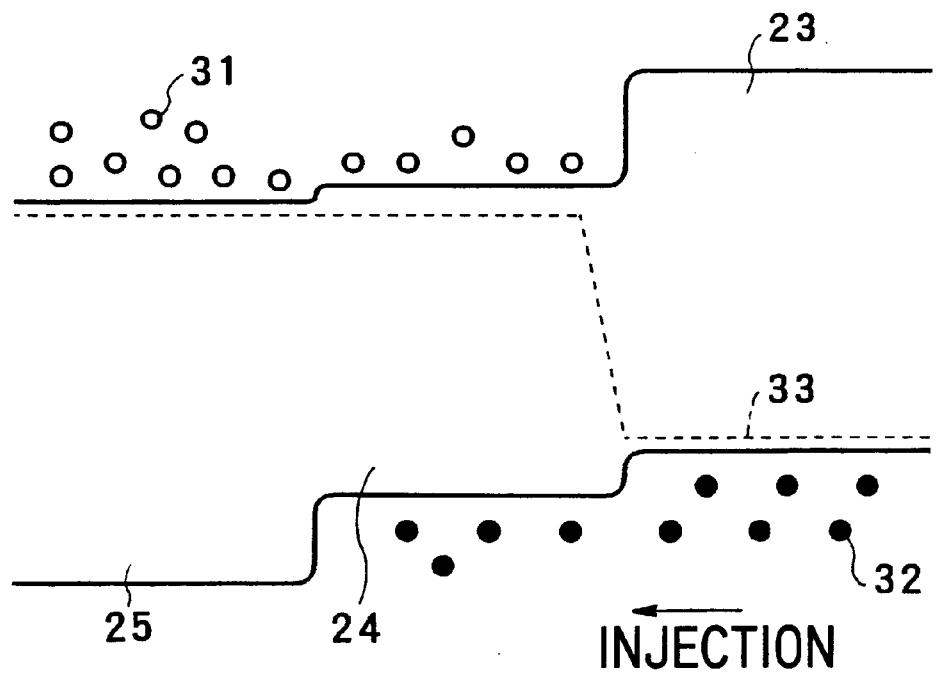
FIG. 23 is an explanatory view showing the dependence of the luminous efficiency on the carrier concentration in the active layer in the semiconductor light-emitting element shown in FIG. 22.
Figure 24:
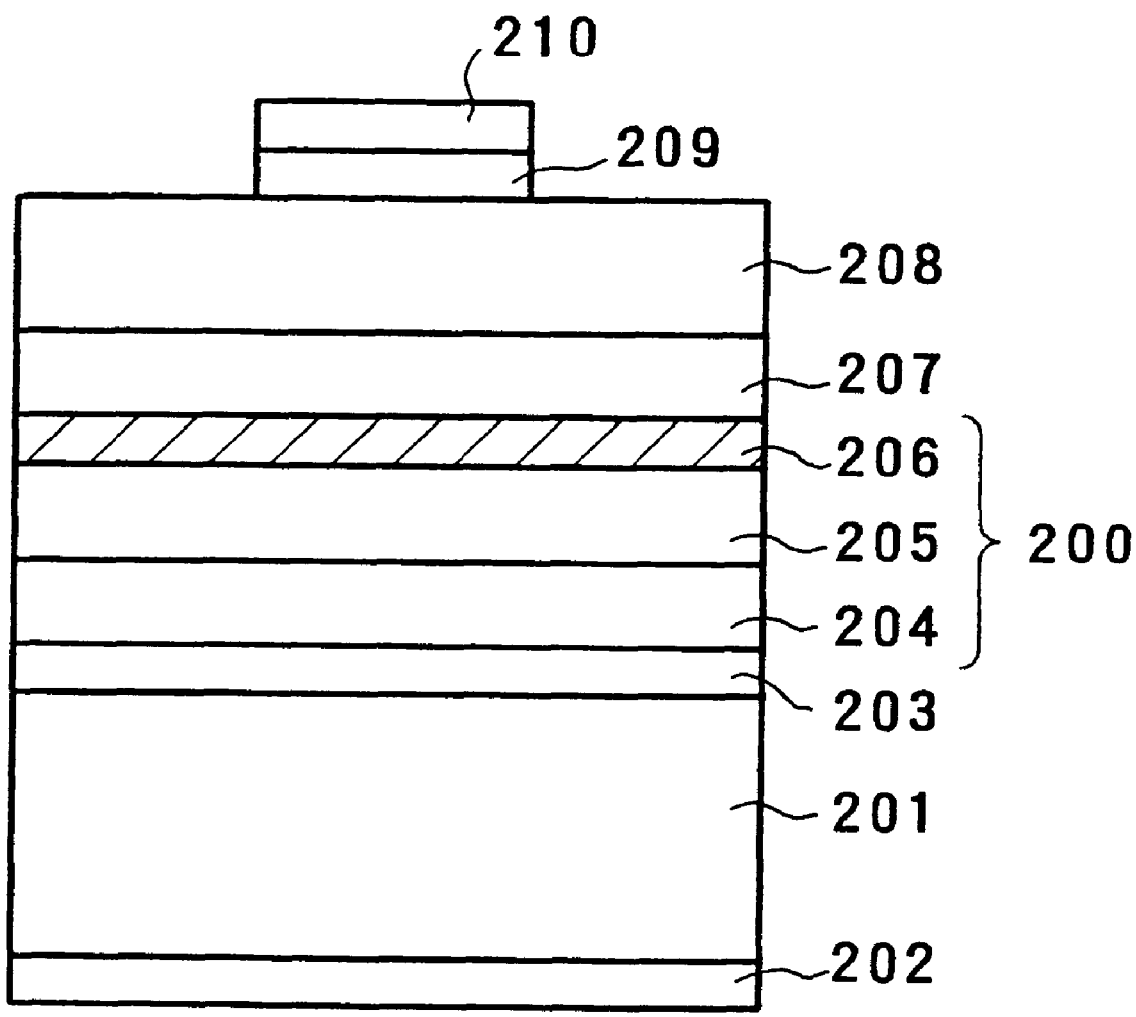
FIG. 24 is a sectional view showing the structure of another semiconductor light-emitting element to which the present invention is directed.

A curve L2 in FIG. 21 represents the relationship between the chip size and luminous efficiency in the element shown in FIG. 24, and L1 represents the relationship between the chip size and luminous efficiency in the seventh embodiment. Since the element shown in FIG. 24 has the ITO film but no current blocking layer, luminous efficiency drops considerably as the chip size decreases. By contrast, in this embodiment, luminous efficiency drop can be suppressed even when the element has a chip size of 250 μm or less.

Figure 12:
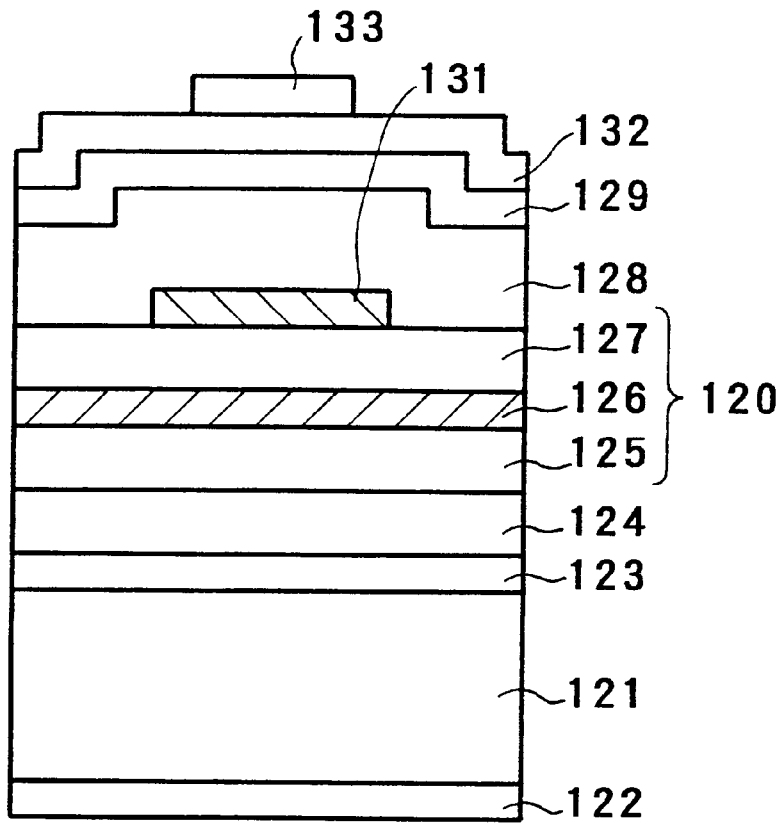
FIG. 12 is a longitudinal sectional view showing the structure of a semiconductor light-emitting element according to the eighth embodiment of the present invention.
Figure 13:
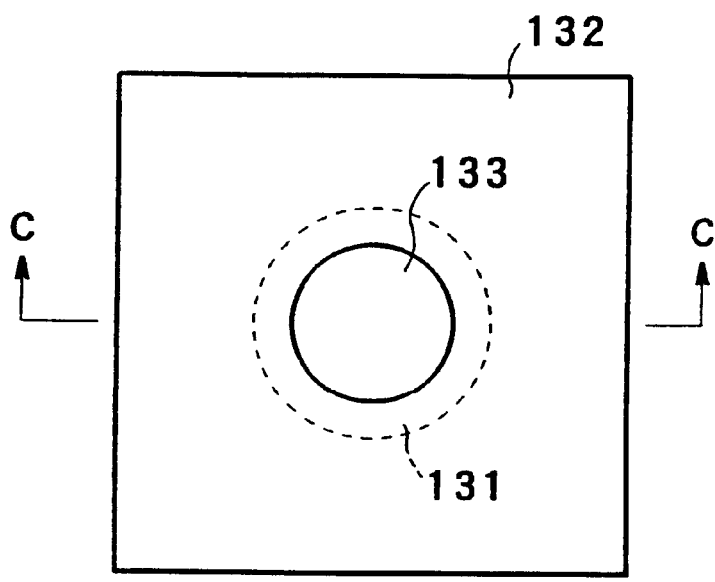
FIG. 13 is a plan view showing the semiconductor light-emitting element shown in FIG. 12.

The eighth embodiment of the present invention will be described below with reference to the accompanying drawings. As shown in FIG. 12, an n-GaAs buffer layer 123, a reflection layer 124 consisting of 10 pairs of n-GaAs/n-In$_{0.5}$Al$_{0.5}$P films, an n-In$_{0.5}$Al$_{0.5}$P cladding layer 125, an In$_{0.5}$(Ga$_{0.55}$Al$_{0.45}$)$_{0.5}$P active layer 126, a p-In$_{0.5}$Al$_{0.5}$P cladding layer 127, an n-In$_{0.5}$Al$_{0.5}$P current blocking layer 131, a p-Ga$_{0.2}$Al$_{0.8}$As current diffusion layer 128, a p-GaAs contact layer 129, an ITO film 132, and a p-electrode 133 are formed in turn on the second major surface of a substrate 121, and an n-electrode 122 is formed on the first major surface of the substrate 121.

This embodiment differs from the seventh embodiment in that the current blocking layer 131 is formed between the cladding layer 127 and current diffusion layer 128. In this embodiment, since the current diffusion layer 128 is not present between the current blocking layer 131 and active layer 126, the distance between the current blocking layer 131 and active layer can be set to be small more easily than the seventh embodiment.

Figure 14:
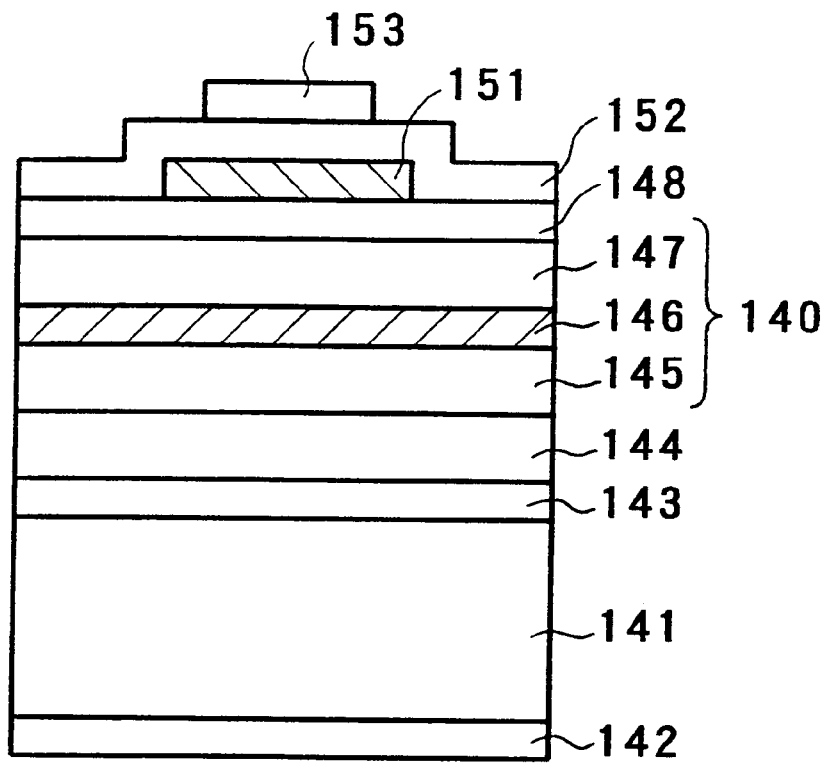
FIG. 14 is a longitudinal sectional view showing the structure of a semiconductor light-emitting element according to the ninth embodiment of the present invention.
Figure 15:
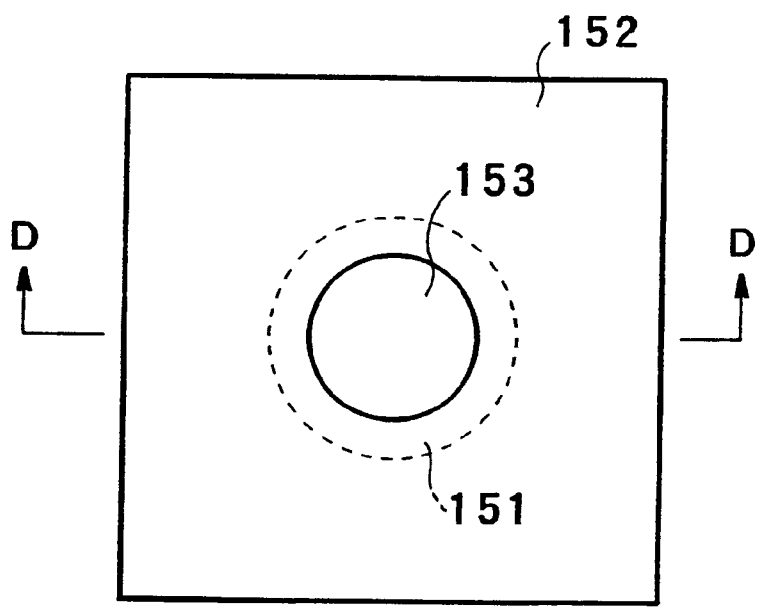
FIG. 15 is a plan view showing the semiconductor light-emitting element shown in FIG. 14.

The ninth embodiment of the present invention comprises a two-dimensional structure shown in FIG. 15 and a longitudinal sectional structure shown in FIG. 14. In a light-emitting element according to this embodiment, an n-GaAs buffer layer 143, a reflection layer 144 consisting of 10 pairs of n-GaAs/n-In$_{0.5}$Al$_{0.5}$P films, an n-In$_{0.5}$Al$_{0.5}$P cladding layer 145, an In$_{0.5}$(Ga$_{0.55}$Al$_{0.45}$)$_{0.5}$P active layer 146, a p-In$_{0.5}$Al$_{0.5}$P cladding layer 147, a p-GaAs contact layer 148, an n-In$_{0.5}$Al$_{0.5}$P current blocking layer 151, an ITO film 152, and a p-electrode 153 are formed in turn on the second major surface of a substrate 141, and an n-electrode 142 is formed on the first major surface of the substrate 141.

This embodiment has its characteristic feature in that the current diffusion layer is not formed. However, in this embodiment as well, the distance between the current blocking layer 151 and active layer 146 is set to fall within the range from 0.3 μm to 3 μm as in the seventh or eighth embodiment. According to this embodiment, since the current diffusion layer is not formed, a manufacturing cost reduction, or improvement of yield due to elimination of any warp of the wafer can be achieved. However, when the element is assembled in an LED lamp or the like, the active layer 146 must be protected from being damaged.

The 10th embodiment of the present invention will be described below with the aid of FIG. 17 that shows its two-dimensional structure, and FIG. 16 that shows the longitudinal section taken along a line E—E in FIG. 17. In this embodiment, an n-GaAs buffer layer 163, a reflection layer 164 consisting of 10 pairs of n-GaAs/n-In$_{0.5}$Al$_{0.5}$P films, an n-In$_{0.5}$Al$_{0.5}$P cladding layer 165, an In$_{0.5}$(Ga$_{0.55}$Al$_{0.45}$)$_{0.5}$P active layer 166, a p-In$_{0.5}$Al$_{0.5}$P cladding layer 167, a p-Ga$_{0.2}$Al$_{0.8}$As current diffusion layer 168, a p-GaAs contact layer 169, an n-In$_{0.5}$Al$_{0.5}$P current blocking layer 171, an ITO film 172a, and a p-electrode 173 are formed in turn on the second major surface of a substrate 161, and an n-electrode 162 is formed on the first major surface of the substrate 161.

This embodiment has its characteristic feature in that the edge portion of the ITO film 172a is located inside those of the contact layer 169, current diffusion layer 168, and the like formed under the ITO film, and a surface 174a of the peripheral portion of the contact layer 169 is exposed. When conductive dust, e.g., GaAs waste or the like becomes attached between the ITO film 172a, and the p-n junction between the active layer 166 and cladding layer 165 or between the active layer 167 and cladding layer 167, static damage may occur. However, since the edge portion of the ITO film 172a is located inside those of the contact layer 169, current diffusion layer 168, and the like, even when dust becomes attached to the p-n junction at the chip edge portion, nearly no voltage is applied to the chip edge portion, and no currents flow via the dust, thus removing ESD breakdown voltage errors.

Figure 16:
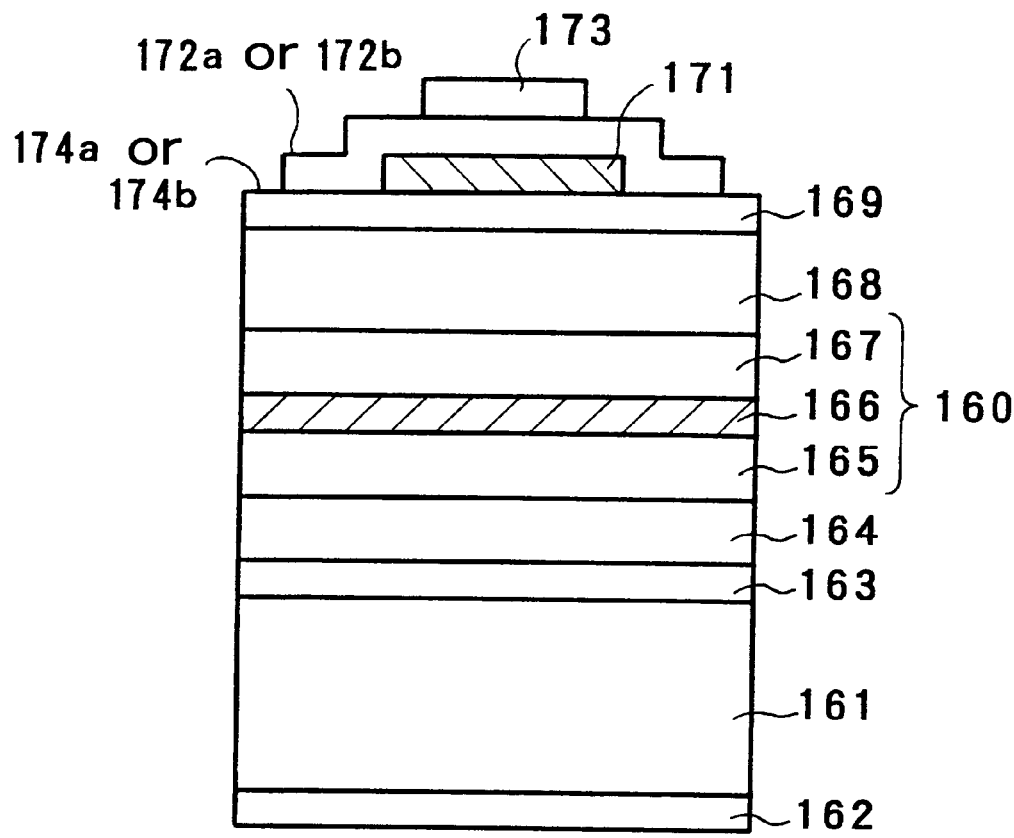
FIG. 16 is a longitudinal sectional view showing the structure of a semiconductor light-emitting element according to the 10th embodiment of the present invention.
Figure 17:
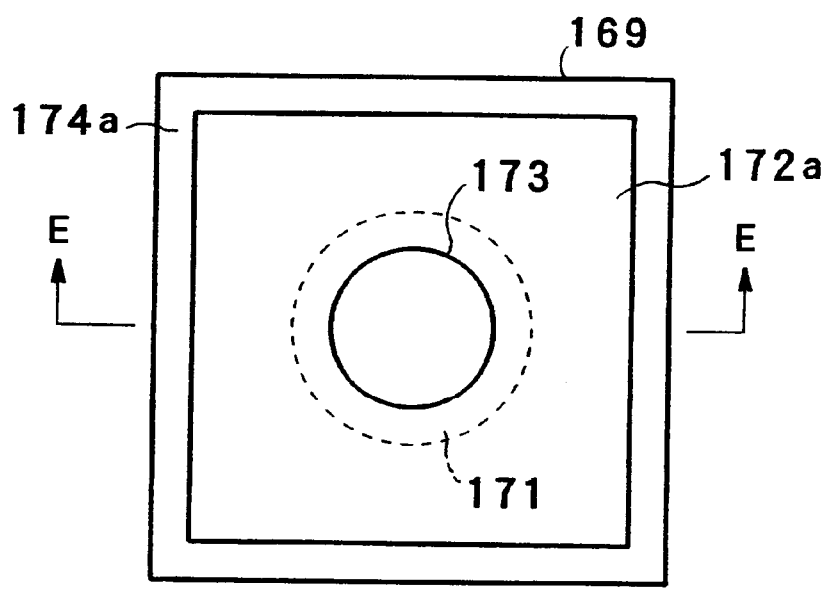
FIG. 17 is a plan view showing the semiconductor light-emitting element shown in FIG. 16.
Figure 18:
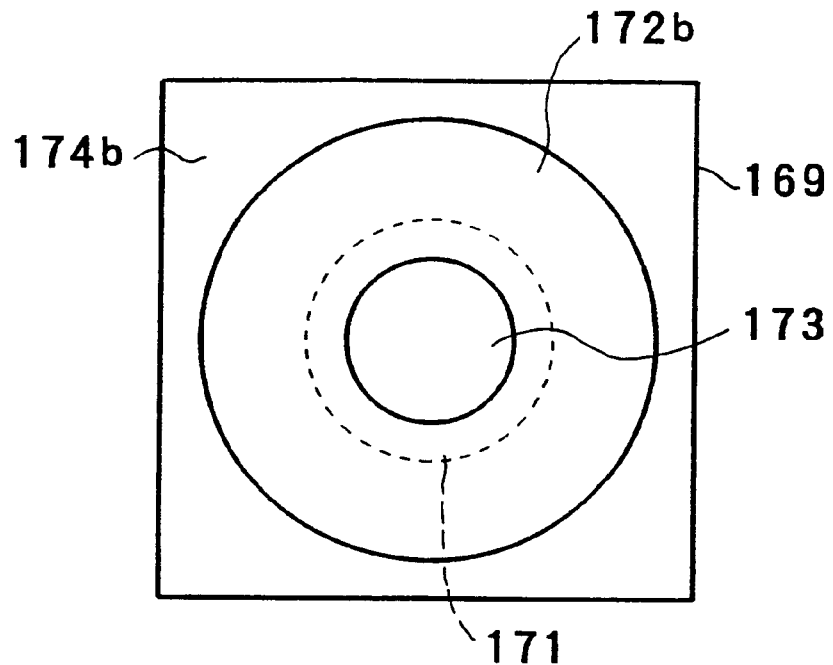
FIG. 18 is a plan view of a semiconductor light-emitting element according to the 11th embodiment of the present invention.

The 11th embodiment of the present invention has the same longitudinal sectional structure as that of the 10th embodiment shown in FIG. 16, but has a different two-dimensional structure. In the 10th embodiment, the ITO film 172a has a rectangular shape, as shown in FIG. 17. By contrast, in this embodiment, as shown in FIG. 18, an ITO film 172b has a circular shape, so as to be separated from the four corners of the chip. Normally, in a device such as an LED lamp or the like using a semiconductor light-emitting element, since a chip is directly encapsulated by a mold resin, the resin expands due to heat produced by the chip during energization. For this reason, strong stress acts on the four corners of the chip, and crystal defects may have been produced and progressed from the four corner portions. In this embodiment, since the edge portion of the ITO film 172b is separated from the four corners of the chip, even when crystal defects have been produced, no currents flow to the four corners and no light is emitted there, thus preventing any light output drop.

Figure 19:
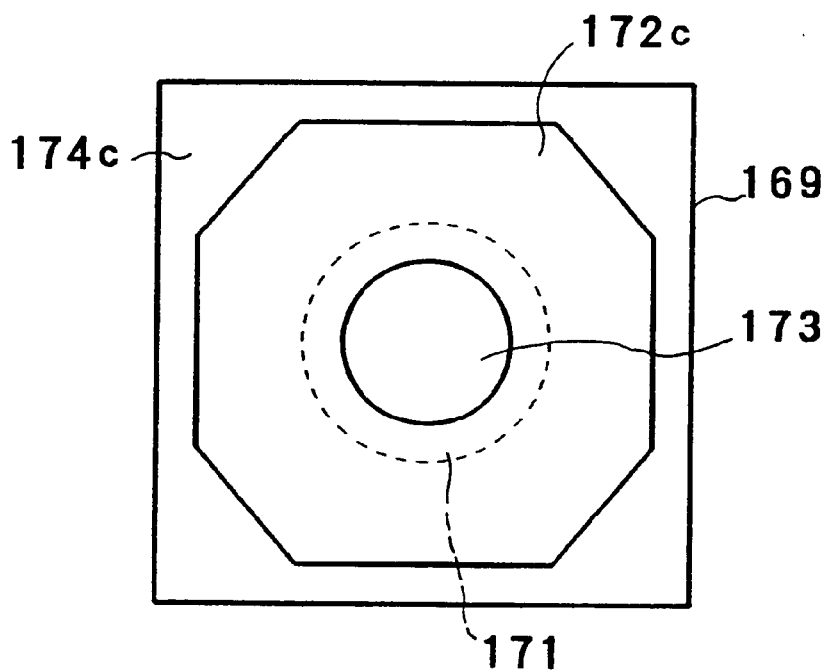
FIG. 19 is a plan view of the semiconductor light-emitting element when a circular ITO film is replaced by a polygonal one.

In the 11th embodiment, the ITO film 172b has a circular shape, as shown in FIG. 18. Alternatively, as shown in FIG. 19, an ITO film 172c may have a polygonal shape. In such case as well, since the edge portion of the ITO film 172c can be separated from the four corners of the chip, the element service life can be improved.

The semiconductor light-emitting elements according to the seventh to 11th embodiments can be assembled in a semiconductor light-emitting device used, as shown in FIG. 6.

The above-mentioned embodiments are merely examples, and do not limit the present invention. For example, in each of the above embodiments, the contact layer is formed between the transparent electrode and current diffusion layer to allow easy current flow therebetween. However, the contact layer need not always be formed.

In each of the above embodiments, a green LED having an In$_{0.5}$(Ga$_{1-x}$Al$_x$)$_{0.5}$P-based crystal has been exemplified. However, by changing the Al ratio of the active layer, LEDs having emission colors ranging from red to green can be formed. Furthermore, in each of the above embodiments, the doublehetero layer consists of an In$_{0.5}$(Ga$_{1-x}$Al$_x$)$_{0.5}$P-based crystal, but may consist of a GaAlAs-based crystal ranging from infrared light to red.

Also, each of the above embodiments uses the substrate having an n-GaAs-based crystal. However, a substrate having a p-GaAs-based crystal may be used, and the polarities of crystals to be formed thereon may be changed in correspondence with that of the substrate.

When the substrate having an n-GaAs-based crystal is used, and the GaAs contact layer is of p type, a very thin, Au-Zu-based alloy or Au-AuZu-based alloy-Au multilevel metallization may be formed between the ITO film and the GaAs contact layer to improve the adhesion therebetween.

Each of the above embodiments uses the ITO film as a transparent electrode. However, the present invention is not limited to such specific film, and films consisting of other materials, such as ZnO, SnO, and the like, may be used.

Upon separating chips from the wafer, the present invention is not limited to scribing & breaking, and dicing using a diamond blade may be used.

According to the first to sixth embodiments, the adhesion with the transparent electrode can be improved. Since an aluminum oxide film is formed on the surface of the current blocking layer containing Al by a heat treatment, a sufficiently high breakdown voltage of the current blocking layer can be maintained. By interposing the Zn layer, the adhesion between the ohmic-contact layer and ITO film, and that between the current blocking layer containing Al and ITO film can be further improved. For this reason, cracking and peeling upon chipping and breaking during scribing from the surface using a scribe device can be remarkably avoided, and elements can be formed using the scribe device. Furthermore, the functions of the current blocking layer do not deteriorate by diffusion of Zn to improve the adhesion, and diffusion of Zn doped in the active layer to improve the luminous efficiency.

In the manufacturing processes of the semiconductor light-emitting element, the Zn thin-film layer is continuously formed by a sputtering device used for forming the transparent electrode, thus further improving the adhesion between the element surface and transparent electrode.

According to the seventh to 11th embodiments, since the distance between the active layer and current blocking layer is set to fall within the range from 0.3 μm to 3 μm, concentration of currents to the portion below the electrode can be suppressed, high luminous efficiency can be assured even when the chip size is reduced, and a cost reduction can also be attained as a result of an element area reduction.

When the edge portion of the transparent electrode is located inside the chip edge portion, static damage arising from dust or the like can be prevented, and the ESD breakdown voltage can be improved.

What is claimed is:

1. A semiconductor light-emitting element comprising:
   a semiconductor substrate;
   a light-emitting region grown on said semiconductor substrate and including an active layer having a p-n junction;
   a transparent electrode formed to cover the entire light-emitting surface of said light-emitting region and containing oxygen for a light output side electrode;
   a bonding electrode formed on said transparent electrode; and
   a current blocking layer formed under said transparent electrode and located immediately below said bonding electrode,
   wherein said current blocking layer consists of a semiconductor having a bandgap not less than an emission wavelength and containing Al, and said current blocking layer is located immediately below said bonding electrode with the center thereof matching the center of said bonding electrode, and a difference between diameters of said current blocking layer and bonding electrode is not less than three times a distance from said current blocking layer to said active layer.

2. An element according to claim 1, wherein at least a portion of said current blocking layer is oxidized.

3. An element according to claim 1, wherein a p-type impurity is doped in said active layer at a concentration of 5E16 to 2E17 cm$^{-3}$.

4. An element according to claim 1, wherein said current blocking layer consists of $In_{0.5}(Ga_{1-x}Al_x)_{0.5}P$ (for $1 \geq x > 0.5$).

5. An element according to claim 1, wherein said transparent electrode consists of a mixture of indium oxide and tin oxide.

6. A semiconductor light-emitting device comprising:
a semiconductor light-emitting element of claim 1;
a bed portion for supporting and fixing said semiconductor light-emitting element;
a dish-shaped reflection plate formed around said bed portion to surround said semiconductor light-emitting element;
a first lead connected to said bed portion;
a second lead;
a bonding wire for electrically connecting said transparent electrode of said semiconductor light-emitting device element and said second lead; and
a resin capsule for encapsulating said semiconductor light-emitting element, portions of said first and second leads, and said bonding wire.

7. A semiconductor light-emitting element comprising:
a semiconductor substrate;
a light-emitting region grown on said semiconductor substrate and including an active layer having a p-n junction;
a transparent electrode formed to cover the entire light-emitting surface of said light-emitting region and containing oxygen for a light output side electrode;
a bonding electrode formed on said transparent electrode;
an ohmic-contact layer formed on said light-emitting region and under said transparent electrode;
a zinc layer or zinc layer containing gold, which is formed between said transparent electrode and said ohmic-contact layer; and
a current blocking layer formed under said transparent electrode and located immediately below said bonding electrode,
wherein said current blocking layer consists of a semiconductor having a bandgap not less than an emission wavelength and containing Al, and
said current blocking layer is located immediately below said bonding electrode with the center thereof matching the center of said bonding electrode, and a difference between diameters of said current blocking layer and bonding electrode is not less than three times a distance from said current blocking layer to said active layer.

8. An element according to claim 7, wherein said zinc layer or zinc layer containing gold has a thickness of 1 to 5 nm.

9. A semiconductor light-emitting element comprising:
a semiconductor substrate;
a light-emitting region grown on said semiconductor substrate and including an InGaAlP-based active region having a p-n junction;
a transparent electrode formed to cover the entire light-emitting surface of said light-emitting region and containing oxygen for a light output side electrode;
a bonding electrode formed on said transparent electrode;
an ohmic-contact layer formed on said light-emitting region and under said transparent electrode; and
a current blocking layer formed under said transparent electrode and said ohmic-contact layer, and located immediately below said bonding electrode,
wherein said current blocking layer consists of a semiconductor having a bandgap not less than an emission wavelength and containing aluminum, and zinc as a p-type impurity is doped in said active layer at a concentration of 5e16 to 2e17 cm$^{-3}$, and
said current blocking layer is located immediately below said bonding electrode with the center thereof matching the center of said bonding electrode, and a difference between diameters of said current blocking layer and bonding electrode is not less than three times a distance from said current blocking layer to said active layer.

10. A semiconductor light-emitting element comprising:
a semiconductor substrate;
a light-emitting region formed on said semiconductor substrate, and having a double heterostructure including a cladding layer and active layer to form a p-n junction;
a current blocking layer formed on said light-emitting region; and
a transparent electrode formed on said light emitting region,
wherein a distance between said active layer and said current blocking layer falls within a range from 0.3 $\mu$m to 3 $\mu$m, wherein an edge portion of said transparent electrode is located inside a chip edge portion of said semiconductor light-emitting element.

11. An element according to claim 10, wherein a current diffusion layer having a crystal structure different from said light-emitting region is formed between said light-emitting region and said current blocking layer.

12. An element according to claim 10, wherein a thickness of said semiconductor light-emitting element is not more than 150 $\mu$m.

13. An element according to claim 10, wherein a chip size of said semiconductor light-emitting element is not more than 250 $\mu$m.

14. An element according to claim 10, wherein said transparent electrode has a circular or polygonal shape.

15. A semiconductor light-emitting device comprising:
a semiconductor light-emitting element of claim 10;
a bed portion for supporting and fixing said semiconductor light-emitting element;
a dish-shaped reflection plate formed around said bed portion to surround said semiconductor light-emitting element;
a first lead connected to said bed portion;
a second lead;
a bonding wire for electrically connecting said transparent electrode of said semiconductor light-emitting device element and said second lead; and
a resin capsule for encapsulating said semiconductor light-emitting element, portions of said first and second leads, and said bonding wire.

* * * * *